(12) United States Patent
Scharf et al.

(10) Patent No.: US 9,228,145 B2
(45) Date of Patent: Jan. 5, 2016

(54) ANTI-FRETTING WEAR COATING FOR SUBSTRATES

(75) Inventors: Thomas W. Scharf, Prosper, TX (US); Hamidreza Mohseni, Denton, TX (US); Jaimie S. Tiley, Brookville, OH (US)

(73) Assignee: University of North Texas, Denton, TX (US)

( * ) Notice: Subject to any disclaimer, the term of this patent is extended or adjusted under 35 U.S.C. 154(b) by 694 days.

(21) Appl. No.: 13/475,616

(22) Filed: May 18, 2012

(65) Prior Publication Data

US 2013/0130014 A1 May 23, 2013

Related U.S. Application Data

(60) Provisional application No. 61/488,583, filed on May 20, 2011.

(51) Int. Cl.

| C10M 107/00 | (2006.01) |
| --- | --- |
| B32B 33/00 | (2006.01) |
| B32B 9/04 | (2006.01) |
| B32B 5/18 | (2006.01) |
| C23C 16/455 | (2006.01) |
| C23C 16/40 | (2006.01) |
| C10M 103/06 | (2006.01) |

(52) U.S. Cl.
CPC .. *C10M 7/00* (2013.01); *B32B 5/18* (2013.01); *B32B 9/04* (2013.01); *B32B 33/00* (2013.01); *C10M 103/06* (2013.01); *C23C 16/403* (2013.01); *C23C 16/405* (2013.01); *C23C 16/407* (2013.01); *C23C 16/45525* (2013.01); *C10M 2201/062* (2013.01); *C10M 2201/0623* (2013.01); *C10N 2210/02* (2013.01); *C10N 2210/03* (2013.01); *C10N 2210/04* (2013.01); *C10N 2230/06* (2013.01); *C10N 2250/08* (2013.01); *Y10T 428/249957* (2015.04); *Y10T 428/30* (2015.01)

(58) Field of Classification Search
None
See application file for complete search history.

(56) References Cited

U.S. PATENT DOCUMENTS

2001/0031365 A1 * 10/2001 Anderson et al. ............. 428/432
2005/0031843 A1 * 2/2005 Robinson et al. .......... 428/293.4

OTHER PUBLICATIONS

Sheehan, J. E., et al.; Carbon—Carbon Composites; Annu. Rev. Mater. Sci., 24, pp. 19-44, 1994.
Huang, Jian-Feng, et al.; Oxidation Resistant Yttrium Silicates Coating for Carbon—Carbon Composites Prepared by a Novel In-Situ Formation Method; Ceramics International, 33, pp. 887-890, May 3, 2006.
Park, Soo-Jin, et al.; Effect of Oxidation Inhibitor on the Low Energy Tribological Behavior of Carbon—Carbon Composites; Carbon, 40, pp. 835-843, 2002.
Doll, G.L., et al.; Chemical Vapor Deposition and Atomic Layer Deposition of Coatings for Mechanical Applications; Journal of Thermal Spray Technology, 19, pp. 510-516, Jan. 2010.

* cited by examiner

*Primary Examiner* — Sheeba Ahmed
(74) *Attorney, Agent, or Firm* — Jackson Walker L.L.P.

(57) ABSTRACT

A method and chemical composition and material structure for improving fretting wear in substrates, particularly carbon-carbon composite (CCC). The invention relates to trilayer coatings, comprising a base of hard $ZrO_2$, a middle layer of $Al_2O_3$, and a top layer of lubricious ZnO. The coatings of the present invention exhibit conformality and pore-filling down to approximately 100 microns into a carbon-carbon composite to which they are applied. The methods for preparing the coatings include a chemical vapor infiltration route, such as an atomic layer deposition (ALD) process, to uniformly and conformally coat the porous and open structure of CCC with a solid lubricant trilayer of $ZnO/Al_2O_3/ZrO_2$ that results in significant improvement (65%) in fretting wear.

9 Claims, 7 Drawing Sheets

ANTI-FRETTING WEAR COATING FOR SUBSTRATES

RELATED APPLICATION

This application claims priority to U.S. Provisional Patent Application, Ser. No. 61/488,583, entitled "ANTI-FRETTING WEAR COATING FOR SUBSTRATES," filed on May 20, 2011, the entire content of which is hereby incorporated by reference.

BACKGROUND

The present invention relates generally to the field of coatings for various substrates, including carbon-carbon composite (CCC). In some embodiments, the invention relates to coatings comprising trilayers of $ZnO/Al_2O_3/ZrO_2$.

Carbon-carbon composite (CCC), a well-recognized aerospace structural material, is known for its high-temperature strength and low relative density. For example, jet engine manufacturers use composite variable stator vane bushings, such as CCC, in commercial and military jet engines. Conventional pure (untreated) CCC exhibits fretting wear after a certain amount of operational use and subsequently must be replaced at a significant cost.

Fretting (oscillatory) wear of pure (uncoated) CCC limits its lifetime in applications, such as bushings used in jet engine blisks (blade integrated disks), which are compressor impellers with integrated blading for commercial and military jet engines. Commercial, porous CCC bushings still require replacement as part of routine scheduled-based maintenance by jet engine manufacturers.

SUMMARY

The present invention relates generally to a method and chemical composition and material structure for improving fretting wear in various substrates, including carbon-carbon composite (CCC).

The present invention alleviates the problem of fretting or oscillatory wear by chemically infiltrating porous CCC with structurally-engineered lubricious trilayers of $ZnO/Al_2O_3/ZrO_2$ coatings which resulted in a 65% fretting wear improvement in comparison to uncoated CCC. The present invention comprises a chemical vapor infiltration route, the atomic layer deposition (ALD) process, to uniformly and conformally coat the porous/open structure of CCC with a solid lubricant/hard trilayer of $ZnO/Al_2O_3/ZrO_2$ that results in significant improvement (65%) in fretting wear.

In one embodiment, the invention relates to trilayer coatings, comprising a base of $ZrO_2$, a middle layer of $Al_2O_3$, and a top layer of ZnO. This combination of layers results in unique and ideal properties. Tetragonal $ZrO_2$ is known as the highest fracture toughness ceramic with subsurface load-bearing capabilities. Amorphous $Al_2O_3$ insures that the right ZnO growth texture (c-axis basal plane orientation) is achieved because it suppresses growth of competing ZnO prismatic and pyramidal planes. Finally, ZnO is a lubricious layer since it is softer and has lower friction (interfacial shear) due to easy basal plane slip/shear. The coatings of the present invention may exhibit conformality and pore-filling down to approximately 75 to 125 microns, or more preferably approximately 100 microns, into a carbon-carbon composite to which they are applied.

The present invention also relates to methods for fabricating trilayer coatings comprising ZnO, $Al_2O_3$, and $ZrO_2$. The methods may comprise a chemical vapor infiltration route, such as an atomic layer deposition (ALD) process, to uniformly and conformally coat the porous and open structure of CCC with a solid lubricant/hard trilayer of $ZnO/Al_2O_3/ZrO_2$ that results in significant improvement (65%) in fretting wear.

Other than CCC, the trilayer coating can be deposited on different substrates to improve fretting wear, including M50 tool steel for bearing applications and silicon wafers for silicon-based microelectromechanical systems (MEMS) devices. In general, the trilayers are good candidates for providing low friction, wear and good rolling contact fatigue resistance in moving mechanical assemblies that require thin (~10-300 nm), uniform and conformal solid lubricant films.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION OF PREFERRED EMBODIMENTS

Figure 1:
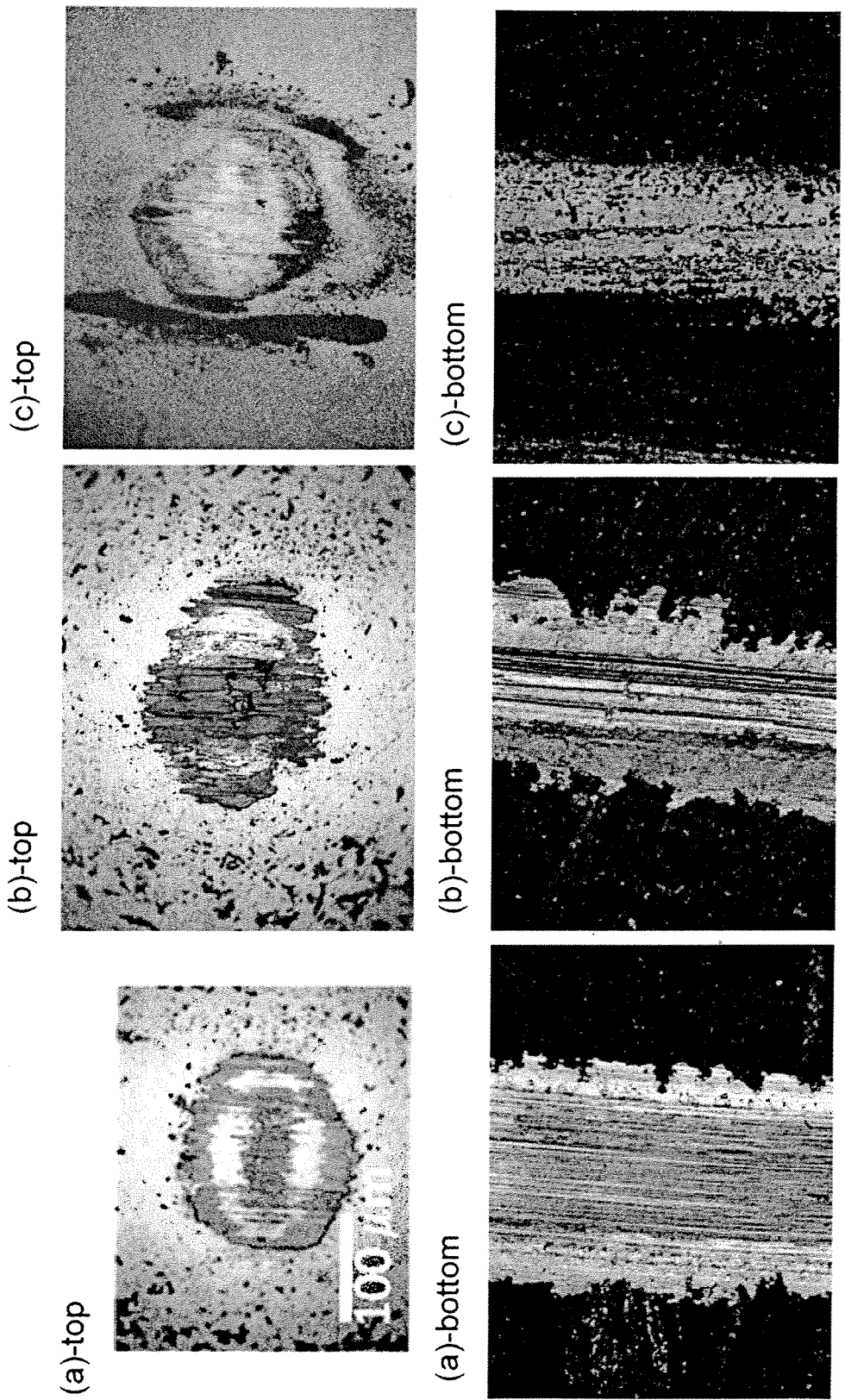
FIG. 1 shows optical images of worn contacting surfaces of (a) CCC-uncoated; (b) worn surfaces of $CCC-ZrO_2$: and (c) worn surfaces of $CCC-ZnO/Al_2O_3/ZrO_2$ (top: transfer films on 440 C counterfaces; and bottom: wear tracks)
Figure 2:
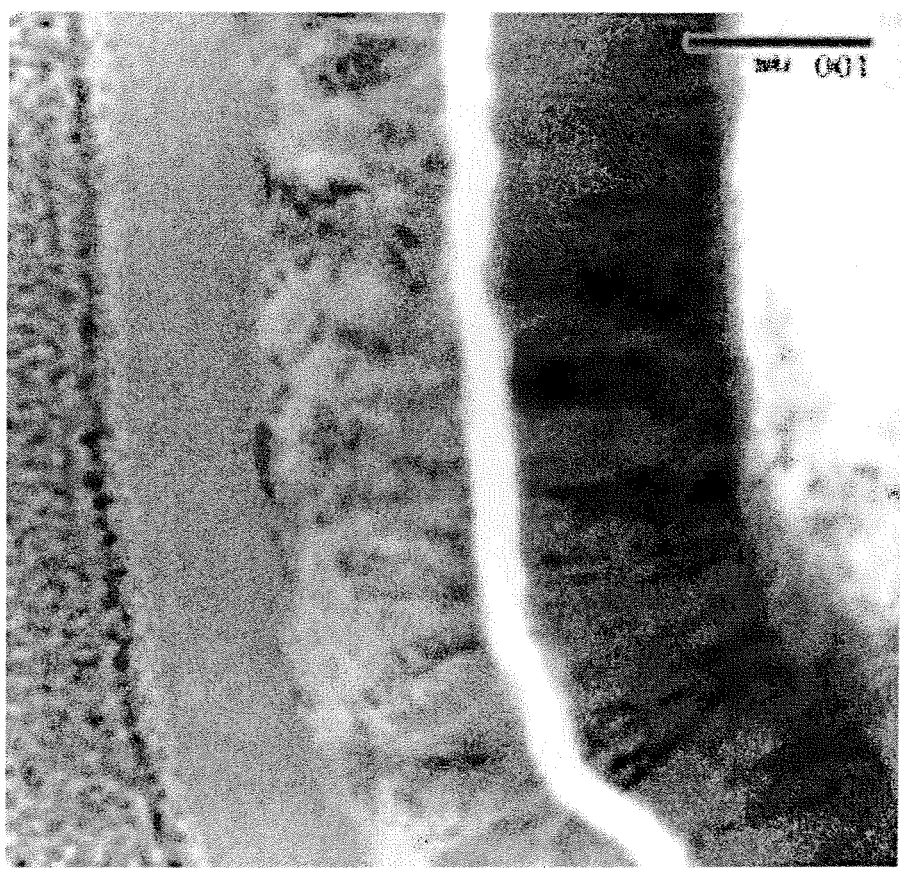
FIG. 2 shows high resolution transmission electron microscopy (HRTEM) image of 1 trilayer before high frequency reciprocating rig (HFRR) test.
Figure 3:
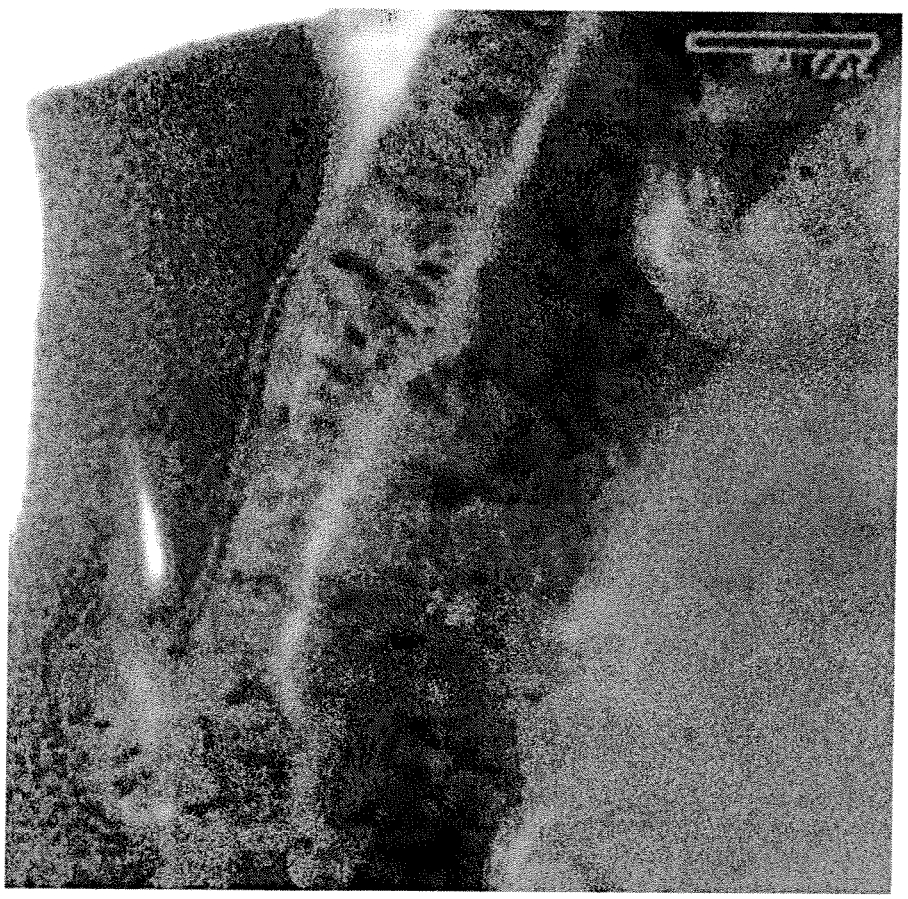
FIG. 3 shows HRTEM analysis of 1 trilayer after HFRR test.
Figure 4:
FIG. 4 shows HRTEM analysis of high density of ZnO basal stacking faults inside a wear track of 1 trilayer along the reciprocating sliding direction.
Figure 5:
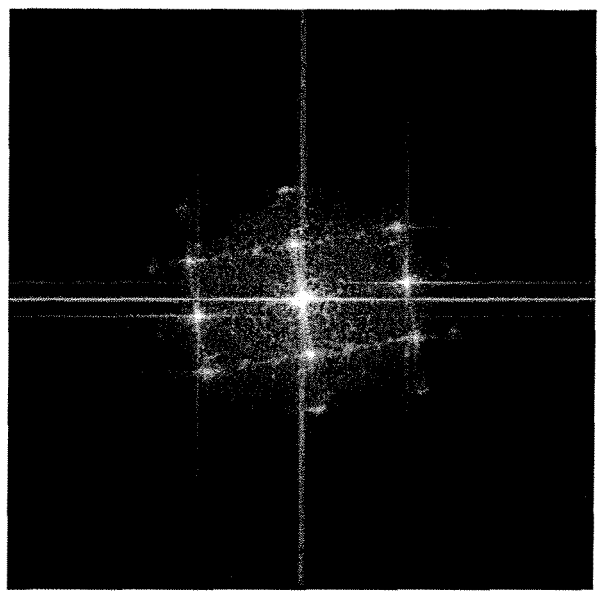
FIG. 5 shows corresponding HRTEM analysis of FFT pattern showing diffraction spot of (0002)-basal planes of ZnO.

The present invention relates generally to a method and a chemical composition and material structure for improving fretting wear in substrates, particularly carbon-carbon composite (CCC). In one embodiment, the invention relates to trilayer coatings, comprising ZnO, $Al_2O_3$, and $ZrO_2$. The coatings of the present invention may exhibit conformality and pore-filling down to approximately 100 microns into a carbon-carbon composite to which they are applied. The present invention also relates to methods for fabricating trilayer coatings comprising ZnO, $Al_2O_3$, and $ZrO_2$.

Chemical Composition and Material Structure for Coating CCC

In one embodiment, the invention comprises a chemical composition and material structure for use in coating substrates such as CCC. In this embodiment, the composition and structure may comprise trilayer coatings which include ZnO (wurtzite structure), $Al_2O_3$ (amorphous structure), and $ZrO_2$ (tetragonal structure). The trilayer coatings may have the properties of being lubricious, and may exhibit conformality and pore-filling down to approximately 100 microns into the CCC.

In one embodiment of the invention, the coating of the CCC has a base of hard $ZrO_2$, a middle layer of $Al_2O_3$, and a top layer of lubricious ZnO.

CCC coated with the trilayer coatings of the present invention may exhibit less fretting wear than uncoated carbon-carbon composite. The decrease in fretting wear may be 65% or greater in carbon-carbon composite treated with the trilayer coatings compared to untreated carbon-carbon composite.

CCC coated with the trilayer coatings of the present invention may also exhibit self-lubricating behavior at ambient temperature or in higher temperature environments.

In one embodiment of the present invention, the trilayer coating can be applied to the surface of the CCC at a thickness of approximately 250 nm, as well as coat the subsurface pores (which are approximately 1-3 μm in diameter) down to approximately 100 μm in depth.

Method of Coating a Carbon-Carbon Composite

In one embodiment, the present invention comprises a method for coating a carbon-carbon composite. The method may comprise a chemical vapor infiltration route, such as an atomic layer deposition (ALD) process, to uniformly and conformally coat the porous and open structure of CCC with a hard/solid lubricant trilayer of $ZnO/Al_2O_3/ZrO_2$ that results in significant improvement (65%) in fretting wear.

The present invention further comprises an ALD process which is capable of uniformly and conformally coating both the surface of the CCC at a thickness of approximately 250 nm, as well as coat the subsurface pores (1-3 μm diameter) of the CCC down to approximately 100 m depth.

Deposition parameters such as pulse and purge are determined based on various factors such as: substrate geometry, chemical composition of the precursors, and size of the reaction chamber and vapor pressure of precursors. Time of deposition depends on the required thickness of ALD coating and it depends on the growth/cycle rate and accordingly number of deposition cycles.

Generally, the method involves first loading the carbon-carbon composite samples into the reaction chamber of an atomic layer deposition (ALD) system. These are commercially available or may be built according to personal specifications. The pressure in the chamber is then reduced, preferably to about 0.5 Torr vacuum pressure. Nitrogen ($N_2$) gas is allowed to flow through the chamber at a flow rate of about 20 sccm. The $ZrO_2$ deposition occurs first and is a two part (A+B) deposition cycle carried out at 250° C. The A-cycle includes the following steps: (1) 0.4-s pulse of TZr (tetrakis (dimethylamido) zirconium (IV)); (2) 1-s exposure, which allows for TZr to coat subsurface pores; and (3) 60-s purge of $N_2$ gas to remove any excess or unreacted TZr species. The B-cycle includes the following steps: (1) 0.025-s pulse of DI water; (2) 1-s exposure, which allows for DI water to coat subsurface pores; and (3) 60-s purge of $N_2$ gas to remove any excess or unreacted DI water species. This $^{A+B}$ (TZr+DI water) cycling is repeated for the desired number of cycles to achieve the desired film thickness. Preferred cycle numbers are found in Table 1 below.

The $Al_2O_3$ deposition occurs second and is a two part (A+B) deposition cycle carried out at 200° C. The A-cycle includes the following steps: (1) 0.15-s pulse of TMA (trimethyl aluminum); (2) 1-s exposure, which allows for TMA to coat subsurface pores; and (3) 20-s purge of $N_2$ gas to remove any excess or unreacted TMA species. The B-cycle includes the following steps: (1) 0.015-s pulse of DI water; (2) 1-s exposure, which allows for DI water to coat subsurface pores; and (3) 20-s purge of $N_2$ gas to remove any excess or unreacted DI water species. This A+B (TMA+DI $H_2O$) cycling is repeated for the desired number of cycles to achieve the desired film thickness. Preferred cycle numbers are found in Table 1 below.

The ZnO deposition occurs third and is a two part (A+B) deposition cycle carried out at 200° C. The A-cycle includes the following steps: (1) 0.15-s pulse of DEZ (diethyl zinc); (2) 1-s exposure, which allows for DEZ to coat subsurface pores; and (3) 60-s purge of $N_2$ gas to remove any excess or unreacted DEZ species. The B-cycle includes the following steps: (1) 0.015-s pulse of DI water; (2) 1-s exposure, which allows for DI water to coat subsurface pores; and (3) 60-s purge of $N_2$ gas to remove any excess or unreacted DI water species. This A+B (DEZ+DI $H_2O$) cycling is repeated for the desired number of cycles to achieve the desired film thickness. Preferred cycle numbers are found in Table 1 below. After ZnO layer deposition, the chamber is vented with $N_2$ gas and the samples are removed and cooled in the air and then stored in desiccators.

In one embodiment, the method of the present invention uses ALD chemical precursors tetrakis (dimethylamido) zirconium (IV) (T Zr), trimethyl aluminum (TMA), and diethyl zinc (DEZ), for deposition of zirconium oxide ($ZrO_2$), aluminum oxide ($Al_2O_3$), and zinc oxide (ZnO), respectively, along with deionized water (DI $H_2O$). T Zr may be applied at a deposition temperature of approximately 250° C., TMA may be applied at a deposition temperature of approximately 200° C. and DEZ may be applied at a deposition temperature of approximately 200° C. In one embodiment of the invention, the ALD chemical precursors used to deposit the trilayer are shown in Table 1.

TABLE 1

ALD chemical precursors and deposition steps in an embodiment of the present invention.

| Precursor | Pulse (s) | Exposure (s) | Purge (s) | Cycle # | Deposition Temperature (° C.) | GPC (Å/Cycle) |
|---|---|---|---|---|---|---|
| T Zr | 0.4 | 1 | 60 | 1063 | 250 | 0.94 |
| DI $H_2O$ | 0.025 | 1 | 60 | | | |
| TMA | 0.015 | 1 | 20 | 204 | 200 | 0.98 |
| DI $H_2O$ | 0.015 | 1 | 20 | | | |
| DEZ | 0.015 | 1 | 60 | 690 | 200 | 1.45 |
| DI $H_2O$ | 0.015 | 1 | 60 | | | |

The values in Table 1 are considered preferred values that were determined after extensive testing and measuring the growth/cycle of each oxide film and optimizing the ALD processing parameters accordingly. Some variation from these exact numbers is expected and is permissible. However, lower or higher values may result in non-ALD growth conditions. For example, instead of layer-by-layer ALD growth, chemical vapor deposition (CVD) conditions may result. Those skilled in the art are capable of determining the parameters that are appropriate.

In one embodiment, the present invention comprises the use of the ALD $ZnO/Al_2O_3/ZrO_2$ nanolaminate coatings as described herein for providing low friction and wear surfaces, subsurfaces and interfaces in moving mechanical assembles, such as CCC bushings that experience fretting wear.

EXAMPLE 1

CCC with approximately 21% total porosity and approximately 75% open porosity was coated. ALD was used as the deposition technique with metalorganic precursors of tetrakis (dimethylamido) zirconium (IV), trimethyl aluminum (TMA), and diethyl zinc (DEZ), for deposition of $ZrO_2$, $Al_2O_3$, and ZnO, respectively, along with deionized (DI) $H_2O$. Pure $ZrO_2$ and one trilayer of $ZnO/Al_2O_3/ZrO_2$ of total thickness of approximately 250 nm were infiltrated into the CCC monoliths. Once the ALD deposition sequence was completed, the coated CCC was removed from the reaction chamber and cooled to ambient temperature. The microstructure and composition were examined with advanced electron microscopy and chemical spectroscopy techniques. In parallel, fretting wear behavior was evaluated with a high frequency reciprocating rig.

To simulate the fretting wear of uncoated and coated CCC, a high frequency reciprocating rig (HFRR) was operated at room temperature with a normal load of 1 N using a 440 C stainless steel (SS) counterface under a stroke length of 1 mm and reciprocating frequency of 20 Hz for 130 min.

The ALD coatings exhibited excellent conformality and porefilling down to approximately 100 microns into the CCC. Discernible visual differences in the wear track width and amount of transfer film on the counterface in FIG. 1 indicates improved wear resistance with the ALD coatings. A ~65% improvement in the wear factor (down to $1.5 \times 10^{-6}$ mm$^3$/Nm) was achieved with the ALD infiltration of the 1 trilayer of $ZnO/Al_2O_3/ZrO_2$ compared to uncoated CCC.

The wear rate (wear factor) is calculated using the volume loss of materials due to contact divided by load and total distance that the counterface (stainless steel ball) traveled on the CCC surface:

$$\text{Wear Factor}(WF) = \frac{\text{volume loss}}{\text{load} \cdot \text{distance}} \equiv \left(\frac{mm^3}{N \cdot m}\right)$$

Comparison of the wear factor for uncoated CCC (control) vs. ALD one trilayer (coated) CCC resulted in a 65% improvement (calculated as the difference in WF for coated vs. control) in fretting wear. The difference in fretting WF was calculated after HFRR test duration of 130 minutes. The denominator in the WF value includes load (N for Newtons) and distance (m).

Figure 6:
FIG. 6 shows a high resolution scanning transmission electron microscopy (HRTEM) image of mechanically mixed layer (MML) after the HFRR test.
Figure 7:
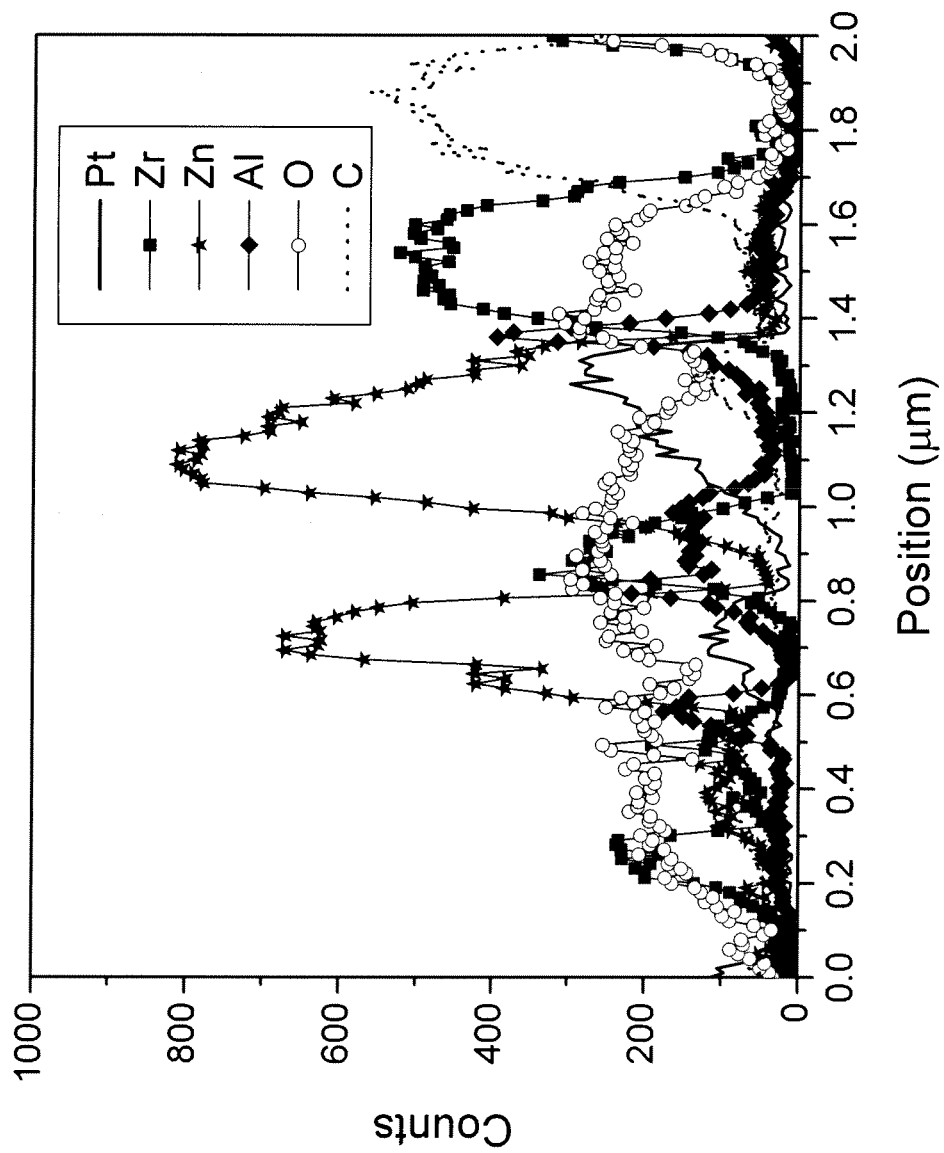
FIG. 7 shows corresponding EDS elemental line profile in which the label "Pt" indicates a protective layer for FIB-sectioning.

Cross-sectional transmission electron microscopy (XTEM) studies of the worn surfaces were performed to elucidate the solid lubrication mechanisms responsible for these improvements. FIGS. 2-7 show XTEM images of the 1 trilayer (FIG. 2) before and (FIG. 3) after HFRR testing. Wear is only observed in the top ZnO layer, in which there was a high density of sliding (shear)-induced stacking faults inside the wear tracks shown in FIG. 4 in comparison to the unworn trilayer. The corresponding FFT-pattern in FIG. 5 was indexed to the (0002) basal plane. Activating subsurface basal stacking faults will promote intrafilm shear/slip and hence improve wear. The slip of partial dislocations likely resulted from a dislocation glide process along the basal planes. Also, a high resolution scanning TEM (HRSTEM) image and corresponding energy dispersive x-ray spectroscopy (EDS) elemental line scan are shown in FIG. 6 and FIG. 7, respectively. The image and line scan show the existence of a mechanically mixed layer (MML) that contained no iron from the counterface. Intrafilm shear with this friction induced subsurface (mechanically mixed layer) aids in shear accommodation (prevents brittle fracture).

References Cited

The following references, to the extent that they provide exemplary procedural or other details supplementary to those set forth herein, are specifically incorporated herein by reference.

Non-Patent References

Sheehan J. E., Buesking K. W. and Sullivan B. (1994), "Carbon-Carbon Composites," *Annu. Rev. Mater. Sci.*, 24, pp. 19-44.

Huang, J. F., Li. H. J., Zeng, X. R., Deng, F., Xiong, X. B. and Li, K. Z. (2007), "Oxidation Resistant Yttrium silicates Coating for Carbon/Carbon Composites Prepared by a Novel In-Situ Formation Method," *Ceramic Inter.*, 33, pp. 887-890.

Park, S. J., Seo, M. K. and Lee, J. R. (2002), "Effect of Oxidation Inhibitor on the Low Energy Tribological Behavior of Carbon-Carbon Composites," *Carbon*, 40, pp. 835-843.

Doll, G. L., Mensah, B. A., Mohseni, H. and Scharf, T. W. (2010), "Chemical Vapor Deposition and Atomic Layer Deposition of Coatings for Mechanical Applications," *J. Thermal Spray Tech.*, 19, pp. 510-516.

What is claimed:

1. A substrate coated with a composition comprising an underlayer of zirconium oxide, a second layer of aluminum oxide, and a top layer of zinc oxide, wherein the underlayer, the second layer, and the top layer form a trilayer coating that provides reduced friction and improved fretting wear to the substrate.

2. The substrate of claim 1, wherein the substrate is carbon-carbon composite.

3. The substrate of claim 2, wherein the composition coats the subsurface pores of the carbon-carbon composite down to approximately 100 µm in depth.

4. The substrate of claim 3, wherein the composition coats the surface of the carbon-carbon composite at a thickness of approximately 250 nm.

5. The substrate of claim 2, wherein the composition reduces fretting wear by 65% in coated carbon-carbon composite compared with uncoated carbon-carbon composite.

6. The substrate of claim 1, wherein the composition exhibits self-lubricating behavior at ambient temperature or in higher temperature environments.

7. The coated carbon-carbon composite of claim 1 prepared by the method of:
   a) applying tetrakis (dimethylamido) zirconium (IV) and DI water to a carbon-carbon composite to deposit a zirconium oxide underlayer;
   b) applying trimethyl aluminum to the zirconium oxide underlayer of the carbon-carbon composite to deposit a second layer of aluminum oxide on the carbon-carbon composite; and
   c) applying diethyl zinc and DI water to the second layer of aluminum oxide of the carbon-carbon composite to deposit a top layer of zinc oxide on the carbon-carbon composite, to produce the coated carbon-carbon composite.

8. A substrate coated with a composition comprising an underlayer of zirconium oxide, a second layer of aluminum oxide, and a top layer of zinc oxide, wherein the substrate is carbon-carbon composite.

9. A substrate coated with a composition comprising an underlayer of zirconium oxide, a second layer of aluminum oxide, and a top layer of zinc oxide, wherein the composition coats the surface of the carbon-carbon composite at a thickness of approximately 250 nm.

* * * * *